(12) United States Patent
Hata

(10) Patent No.: US 10,914,794 B2
(45) Date of Patent: Feb. 9, 2021

(54) MEASURING APPARATUS, METHOD, AND STORAGE MEDIUM

(71) Applicant: ADVANTEST CORPORATION, Tokyo (JP)

(72) Inventor: Yoshiyuki Hata, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 256 days.

(21) Appl. No.: 16/249,213

(22) Filed: Jan. 16, 2019

(65) Prior Publication Data

US 2019/0227128 A1    Jul. 25, 2019

(30) Foreign Application Priority Data

Jan. 19, 2018   (JP) .................................. 2018-007258

(51) Int. Cl.
*G01R 33/00* (2006.01)
*G01R 33/02* (2006.01)

(52) U.S. Cl.
CPC ..... *G01R 33/0029* (2013.01); *G01R 33/0017* (2013.01); *G01R 33/0041* (2013.01); *G01R 33/0094* (2013.01); *G01R 33/02* (2013.01)

(58) Field of Classification Search
None
See application file for complete search history.

(56) References Cited

U.S. PATENT DOCUMENTS

| 5,113,136 A | * | 5/1992 | Hayashi | G01R 33/025 324/225 |
| 2017/0219661 A1 | * | 8/2017 | Hata | G01R 33/0041 |

FOREIGN PATENT DOCUMENTS

| JP | 9-325003 | 12/1997 |
| JP | 2014-190774 | 10/2014 |
| JP | 2017-133993 | 8/2017 |

\* cited by examiner

*Primary Examiner* — Jermele M Hollington
*Assistant Examiner* — Suresh K Rajaputra
(74) *Attorney, Agent, or Firm* — Greenblum & Bernstein, P.L.C.

(57) ABSTRACT

A measuring apparatus that measures a measurement target amount generated from a measurement target, includes an additional amount generating section, a sensor, and a deriving section. The additional amount generating section generates an additional amount to be added to the measurement target amount. The sensor measures a composite amount of the measurement target amount added with the additional amount. The deriving section derives the measurement target amount from an output of the sensor. The additional amount is a pulse. The pulse has an amplitude higher than the absolute value of the maximum of the measurement target amount. The maximum of the pulse is zero. The pulse has a frequency high enough to ignore the 1/f noise. The deriving section detects the output value of the sensor to derive the measurement target amount.

12 Claims, 15 Drawing Sheets

MF1

Pulse having the same frequency
as that of MF0

MEASURING APPARATUS, METHOD, AND STORAGE MEDIUM

FIELD OF THE INVENTION

The present invention relates to removing 1/f noise generated in a sensor.

DESCRIPTION OF THE RELATED ART

There has conventionally been known a sensor that measures a week magnetic field (see Abstract of JP 2017-133993 A, for example). There has also been known a position detecting method that utilizes a measurement of magnetic field strength with increased anti-noise performance (see JP H9-325003 A, for example). There has further been known an MI sensor that serves as a magnetic sensor (see Abstract of JP 2014-190774 A, for example).

SUMMARY OF THE INVENTION

It is hence an object of the present invention to reduce errors in measurements due to 1/f noise generated in a sensor such as a magnetic sensor.

According to the present invention, a measuring apparatus that measures a measurement target amount generated from a measurement target, includes: an additional amount generating section that generates an additional amount to be added to the measurement target amount; a sensor that measures a composite amount of the measurement target amount added with the additional amount; and a deriving section that derives the measurement target amount from an output of the sensor, wherein 1/f noise is generated during measurement by the sensor, the output value of the sensor when the composite amount is less than zero is equal to the output value of the sensor when the composite amount is zero, the additional amount is a pulse, wherein the pulse has an amplitude higher than the absolute value of the maximum of the measurement target amount, the maximum of the pulse is zero, and the pulse has a frequency high enough to ignore the 1/f noise, and the deriving section detects the output value of the sensor to derive the measurement target amount.

According to the thus constructed measuring apparatus measures a measurement target amount generated from a measurement target. An additional amount generating section generates an additional amount to be added to the measurement target amount. A sensor measures a composite amount of the measurement target amount added with the additional amount. A deriving section derives the measurement target amount from an output of the sensor. 1/f noise is generated during measurement by the sensor. The output value of the sensor when the composite amount is less than zero is equal to the output value of the sensor when the composite amount is zero. The additional amount is a pulse. The pulse has an amplitude higher than the absolute value of the maximum of the measurement target amount. The maximum of the pulse is zero. The pulse has a frequency high enough to ignore the 1/f noise. The deriving section detects the output value of the sensor to derive the measurement target amount.

According to the measuring apparatus of the present invention, the measurement target amount may be a magnetic field.

According to the present invention, the measuring apparatus may further include a high-pass filter that receives an output of the sensor and attenuates the noise to be lower than a component of the same frequency as that of the pulse for provision to the deriving section.

According to the present invention, the measuring apparatus may further include a summing section that sums outputs of a plurality of the sensors for provision to one of a plurality of the deriving sections.

According to the measuring apparatus of the present invention, outputs of a plurality of the sensors may be provided, respectively, to a plurality of the deriving sections.

According to the present invention, the measuring apparatus may further include a prefix error compensating section that adds an error compensation amount to the composite amount for provision to the sensor.

According to the measuring apparatus of the present invention, an analog output of the sensor may be converted into digital for provision to the deriving section.

According to the present invention, the measuring apparatus may further include an external error compensating section that receives an output of the deriving section to compensate for an error due to the external environment.

According to the present invention, the measuring apparatus may further include: a plurality of channels having a certain one of a plurality of the sensors and a certain one of a plurality of the deriving sections that receives an output of the sensor; and an inter-channel error compensating section that compensates for an error between the channels.

According to the present invention, the measuring apparatus may further include: a high-frequency band error measuring section that measures an error in the output of the deriving section in a frequency band high enough to ignore the 1/f noise; and a frequency determining section that determines the frequency of the pulse based on a measurement of the high-frequency band error measuring section.

According to the present invention, a measuring method for measuring a measurement target amount generated from a measurement target, includes: an additional amount generating step that generates an additional amount to be added to the measurement target amount; a measuring step that measures a composite amount of the measurement target amount added with the additional amount by using a sensor; and a deriving step that derives the measurement target amount from an output of the sensor, wherein 1/f noise is generated during measurement by the sensor, the output value of the sensor when the composite amount is less than zero is equal to the output value of the sensor when the composite amount is zero, the additional amount is a pulse, wherein the pulse has an amplitude higher than the absolute value of the maximum of the measurement target amount, the maximum of the pulse is zero, and the pulse has a frequency high enough to ignore the 1/f noise, and the deriving step detects the output value of the sensor to derive the measurement target amount.

The present invention is a program of instructions for execution by a computer to perform a measuring process of a measuring apparatus that measures a measurement target amount generated from a measurement target, the apparatus including: an additional amount generating section that generates an additional amount to be added to the measurement target amount; and a sensor that measures a composite amount of the measurement target amount added with the additional amount, the measuring process including: a deriving step that derives the measurement target amount from an output of the sensor, wherein 1/f noise is generated during measurement by the sensor, the output value of the sensor when the composite amount is less than zero is equal to the output value of the sensor when the composite amount is zero, the additional amount is a pulse, wherein the pulse has an amplitude higher than the absolute value of the maximum of the measurement target amount, the maximum of the pulse is zero, and the pulse has a frequency high enough to ignore the 1/f noise, and the deriving step detects the output value of the sensor to derive the measurement target amount.

The present invention is a non-transitory computer-readable medium having a program of instructions for execution by a computer to perform a measuring process of a measuring apparatus that measures a measurement target amount generated from a measurement target, the apparatus including: an additional amount generating section that generates an additional amount to be added to the measurement target amount; and a sensor that measures a composite amount of the measurement target amount added with the additional amount, the measuring process including; a deriving step that derives the measurement target amount from an output of the sensor, wherein 1/f noise is generated during measurement by the sensor, the output value of the sensor when the composite amount is less than zero is equal to the output value of the sensor when the composite amount is zero, the additional amount is a pulse, wherein the pulse has an amplitude higher than the absolute value of the maximum of the measurement target amount, the maximum of the pulse is zero, and the pulse has a frequency high enough to ignore the 1/f noise, and the deriving step detects the output value of the sensor to derive the measurement target amount.

DESCRIPTION OF EMBODIMENTS

A description will now be given of an embodiment of the present invention referring to drawings.

First Embodiment

Figure 1:
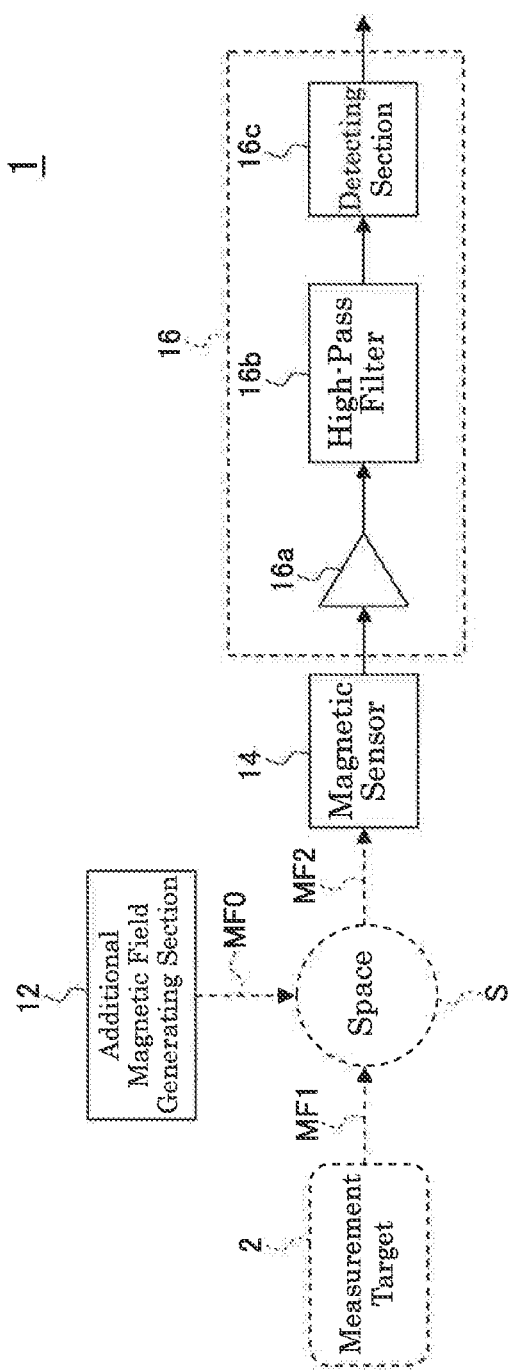
FIG. 1 is a functional block diagram showing the configuration of a measuring apparatus 1 according to a first embodiment of the present invention.

FIG. 1 is a functional block diagram showing the configuration of a measuring apparatus 1 according to a first embodiment of the present invention.

The measuring apparatus 1 according to the first embodiment is arranged to measure a measurement target amount (e.g. measurement target magnetic field MF1) generated by a measurement target 2 (e.g. heart), including an additional magnetic field generating section (additional amount generating section) 12, a magnetic sensor 14, and a sensor output processing section 16.

The additional magnetic field generating section (additional amount generating section) 12 is arranged to generate an additional amount (e.g. additional magnetic field MF0 (see FIG. 3B)) to be added to a measurement target amount (e.g. measurement target magnetic field MF1 (see FIG. 3A)).

The magnetic sensor 14 is arranged to measure a composite amount (e.g. composite magnetic field MF2 (see FIGS. 3C and 4)) of a measurement target amount added with an additional amount. This addition is made in a space S. During measurement by the magnetic sensor 14, 1/f noise is generated (see FIG. 7).

It is noted that the measuring apparatus 1 includes the magnetic sensor 14 in the embodiments of the present invention, though not limited to such a magnetic sensor as long as with a problem of 1/f noise (i.e. the measurement target amount has a frequency low enough not to ignore 1/f noise).

Figure 2:
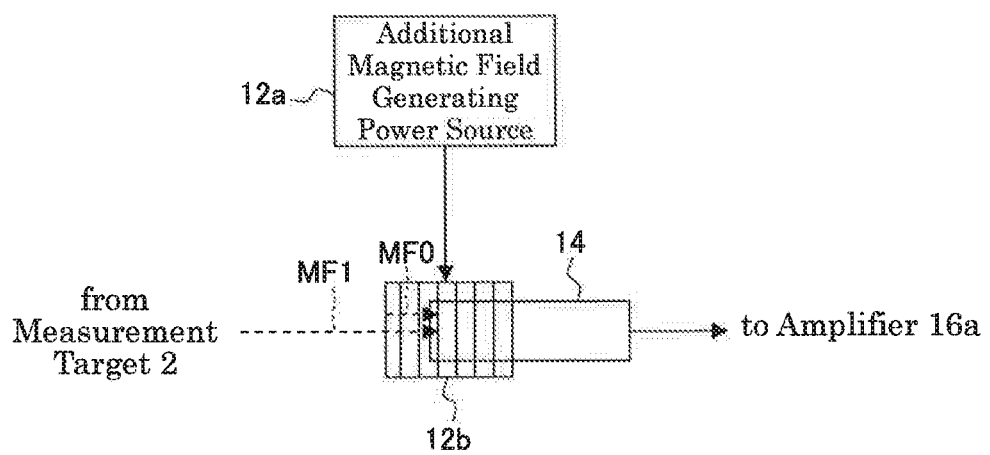
FIG. 2 shows an example of the configuration of the additional magnetic field generating section 12.

FIG. 2 shows an example of the configuration of the additional magnetic field generating section 12. The additional magnetic field generating section 12 has an additional magnetic field generating power source 12a and an additional magnetic field generating coil 12b. The magnetic sensor 14 is, for example, an MI sensor. The magnetic sensor 14 is inserted in the additional magnetic field generating coil 12b.

When the additional magnetic field generating power source 12a applies a current to the additional magnetic field generating coil 12b, an additional magnetic field MF0 is generated within the additional magnetic field generating coil 12b. A measurement target magnetic field is also applied within the additional magnetic field generating coil 12b by the measurement target 2.

Accordingly, the magnetic sensor 14 is applied with a composite magnetic field MF2=MF0+MF1.

The sensor output processing section 16 has an amplifier 16a, a high-pass filter 16b, and a detecting section (deriving section) 16c.

The amplifier 16a is arranged to amplify the output of the magnetic sensor 14. The high-pass filter 16b is arranged to receive the output of the magnetic sensor 14 via the amplifier 16a and attenuate 1/f noise generated in the magnetic sensor 14 to be lower than a component of the same frequency as the frequency f0 (see FIG. 4) of a (pulsed) additional magnetic field MF0 for provision to the detecting section (deriving section) 16c. The detecting section (deriving section) 16c is arranged to receive the output of the magnetic sensor 14 via the amplifier 16a and the high-pass filter 16b and derive a measurement target amount (measurement target magnetic field MF1) from the received output of the magnetic sensor 14. It is noted that the detecting section (deriving section) 16c is arranged to detect the output value of the magnetic sensor 14 to derive a measurement target amount (measurement target magnetic field MF1). It is noted that the detection may be performed using a diode or may be performed using sample-and-hold, envelope detection, synchronous detection, or delay detection.

Next will be described an operation according to the first embodiment.

A measurement target magnetic field MF1 generated by the measurement target 2 is added with an additional magnetic field MF0 generated by the additional magnetic field generating section 12 to be a composite magnetic field MF2 (=MF0+MF1) for provision to the magnetic sensor 14.

Figure 3A:
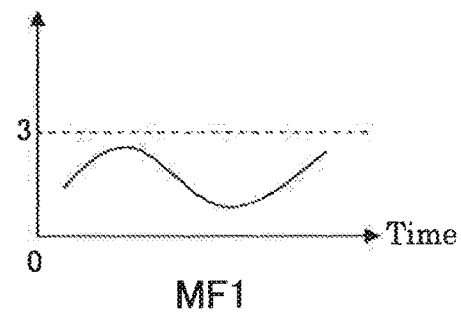
FIGS. 3A-3C show waveforms of a measurement target magnetic field MF1 (FIG. 3A), an additional magnetic field MF0 (FIG. 3B), and a composite magnetic field MF2 (FIG. 3C)
Figure 3B:
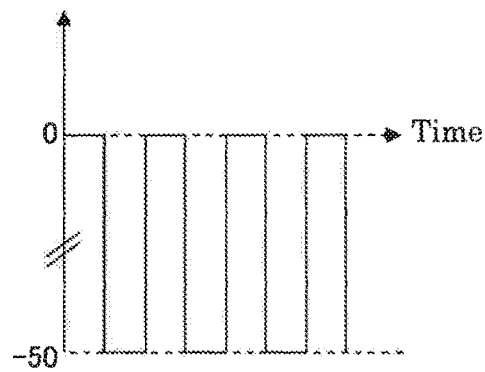
Figure 3C:
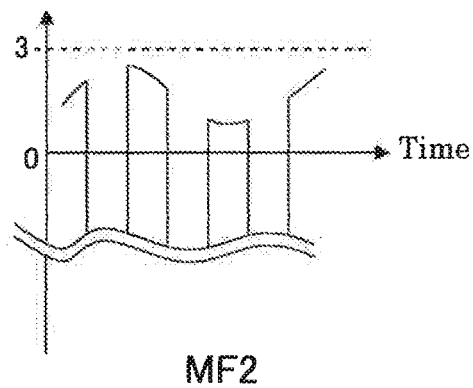
Figure 4:
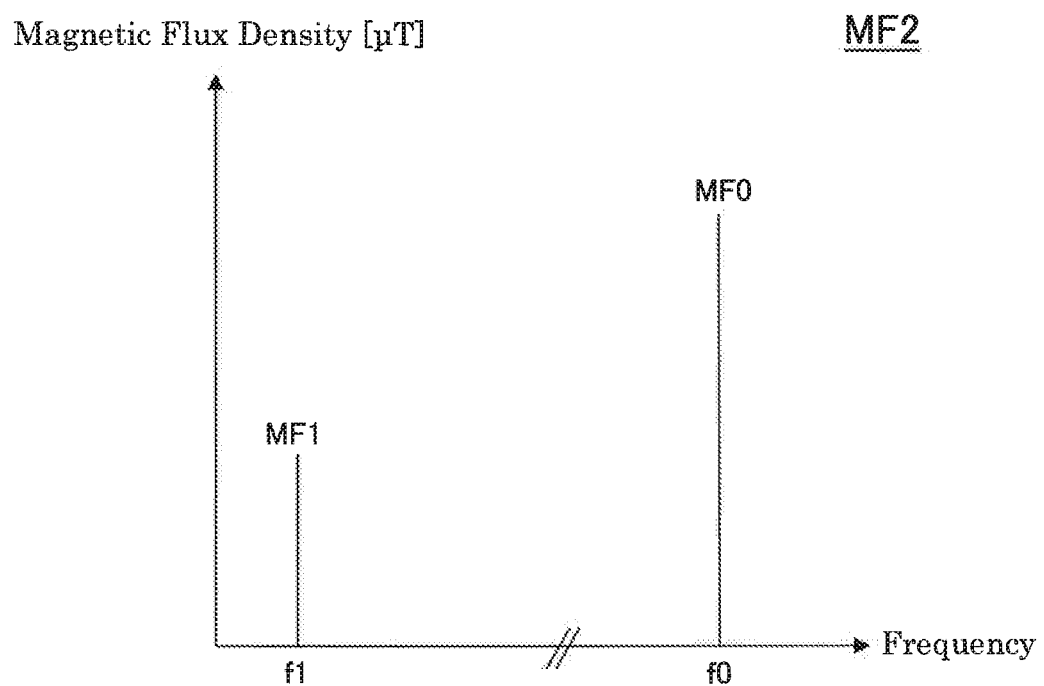
FIG. 4 shows the spectrum of the additional magnetic field MF0 and the measurement target magnetic field MF1.

FIG. 3 shows waveforms of a measurement target magnetic field MF1 (FIG. 3A), an additional magnetic field MF0 (FIG. 3B), and a composite magnetic field MF2 (FIG. 3C). FIG. 4 shows the spectrum of the additional magnetic field MF0 and the measurement target magnetic field MF1. Note that in FIGS. 3 and 4, magnetic field is converted into and illustrated as magnetic flux density [μT].

With reference to FIG. 3A, the measurement target magnetic field MF1 is a very weak magnetic field (e.g. generated by a heart) drawing, with a horizontal axis representing time and a vertical axis representing magnetic flux density [μT], for example, a sine wave having a maximum slightly lower than 3 [μT] and a minimum slightly higher than 0 [μT]. The frequency of the sine wave is a frequency f1 low enough not to ignore 1/f noise generated in the magnetic sensor 14 (see FIG. 7).

In FIG. 3B, the vertical axis is partially skipped between 0 [μT] and −50 [μT]. With reference to FIG. 3B, the additional magnetic field MF0 is a pulse. The pulse has am amplitude (e.g. 50 [μT]) higher than the absolute value of the maximum of the measurement target amount (slightly lower than 3 [μT]). In addition, the maximum of the pulse is zero. The pulse further has a frequency f0 high enough to ignore 1/f noise generated in the magnetic sensor 14 (see FIGS. 4 and 7). The additional magnetic field MF0 is a pulse with a value of 0 [μT] or −50 [μT]. For example, the frequency f0 has a value (e.g. 2 [kHz]) higher than the 1/f corner frequency of noise.

With reference to FIGS. 3C and 4, the composite magnetic field MF2=MF0+MF1.

With reference to FIG. 3C, the composite magnetic field MF2 has the same value as the measurement target magnetic field MF1 when the additional magnetic field MF0 is 0 [μT], while has a value lower than −47 [μT] when the additional magnetic field MF0 is −50 [μT]. Note that in FIG. 3C, the graph is not shown below about −3 [μT].

With reference to FIG. 4, the composite magnetic field MF2 has a component of the frequency f1 (measurement target magnetic field MF1) and a component of the frequency f0 (additional magnetic field MF0). Note that in FIG. 4, harmonic components (2f0, 3f0,) of the additional magnetic field MF0 are not shown (ditto with FIGS. 7 and 8). Also, in FIG. 4, the horizontal axis is partially skipped between the frequency f1 and the frequency f0.

The magnetic sensor 14 is arranged to convert and output the composite magnetic field MF2 into a voltage.

Figure 5:
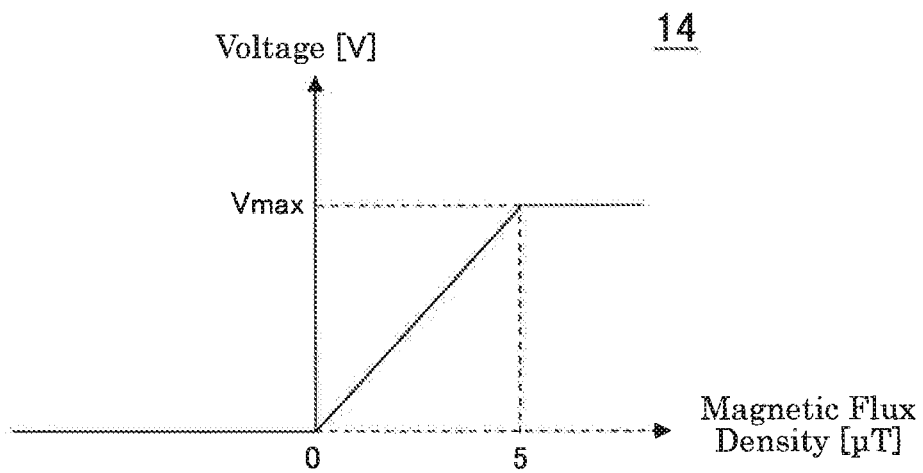
FIG. 5 shows input-output characteristics of the magnetic sensor 14.

FIG. 5 shows input-output characteristics of the magnetic sensor 14. Note that in FIG. 5, the horizontal axis represents the magnetic flux density [μT] as an input and the vertical axis represents the voltage [V] as an output.

The lower limit of the output of the magnetic sensor 14 is saturated when the composite magnetic field MF2 is 0 [μT]. That is, the output value 0 [V] of the magnetic sensor 14 when the composite magnetic field MF2 is lower than zero is equal to the output value 0 [V] of the magnetic sensor 14 when the composite magnetic field MF2 is zero.

It is noted that the upper limit of the output of the magnetic sensor 14 is also saturated at a value (e.g. 5 [μT]) higher than the maximum of the composite magnetic field MF2 (slightly lower than 3 [μT]).

Figure 6A:
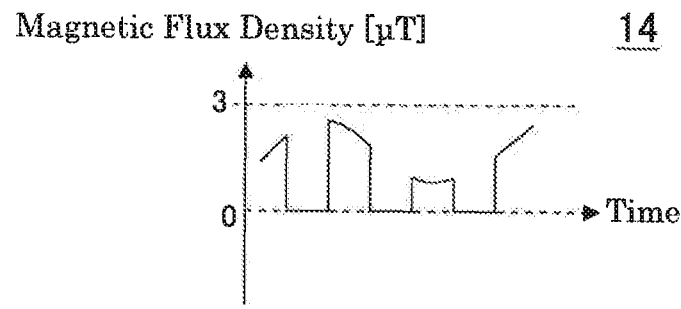
FIGS. 6A-6C show waveforms of the output of the magnetic sensor 14 (FIG. 6A), a measurement target magnetic field MF1 (FIG. 6B), and a pulse of the same frequency as that of the additional magnetic field MF0 (FIG. 6C)
Figure 6B:
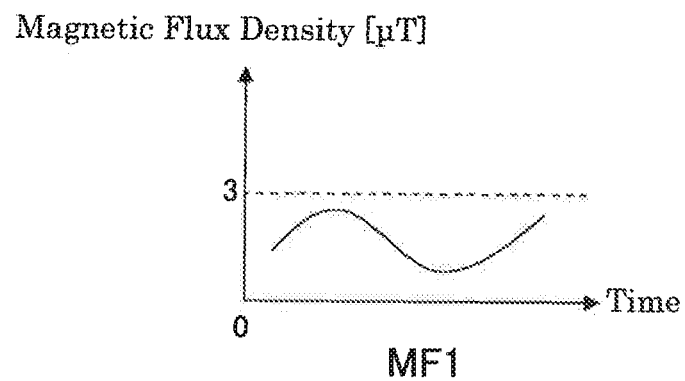
Figure 6C:
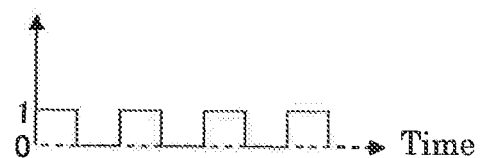

FIG. 6 shows waveforms of the output of the magnetic sensor 14 (FIG. 6A), a measurement target magnetic field MF1 (FIG. 6B), and a pulse of the same frequency as that of the additional magnetic field MF0 (FIG. 6C). Note that in FIGS. 6A and 6B, magnetic field is converted into magnetic flux density [μT].

As described above, the output of the magnetic sensor 14 is saturated when the composite magnetic field MF2 is 0 [μT] (see FIG. 5). Accordingly, the output waveform of the magnetic sensor 14 corresponds to the waveform of the composite magnetic field MF2 (see FIG. 3C) with the magnetic flux density lower than 0 [μT] is set to 0 [μT] (see FIG. 6A). Note that in FIG. 6A, neither 1/f noise nor thermal noise generated from the magnetic sensor 14 is shown.

FIG. 6B shows the same graph as that in FIG. 3A.

FIG. 6C shows a pulse of the same frequency as that of the additional magnetic field MF0, where the vertical axis non-dimensionally takes a value of 1 or 0.

With reference to FIGS. 6A, 6B, and 6C, the output of the magnetic sensor 14 (see FIG. 6A) is obtained by multiplying the measurement target magnetic field MF1 (see FIG. 6B) by the pulse of the same frequency as that of the additional magnetic field MF0 (see FIG. 6C).

Figure 7:
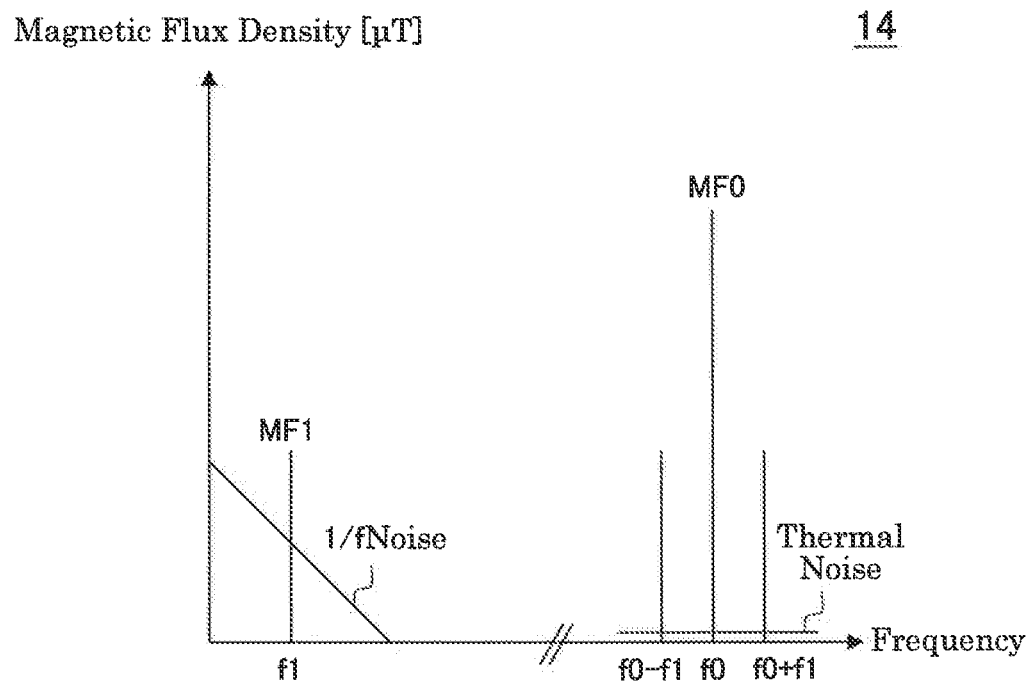
FIG. 7 shows the spectrum of the output of the magnetic sensor 14.

FIG. 7 shows the spectrum of the output of the magnetic sensor 14. Note that in FIG. 7, the output of the magnetic sensor 14 is converted into magnetic flux density [μT]. Also, in FIG. 7, the horizontal axis is partially skipped between the frequency f1 and the frequency f0.

The output of the magnetic sensor 14 is obtained by multiplying the measurement target magnetic field MF1 (frequency f0) by the pulse of the same frequency f0 as that of the additional magnetic field MF0, having a component of the frequency f0+f1 and a component of the frequency f0−f1. The two components can be considered a result of a carrier, which is provided by the pulse of the same frequency f0 as that of the additional magnetic field MF0 (see FIG. 6C), modulated by the measurement target magnetic field MF1.

In addition, the output of the magnetic sensor 14 includes a component of the carrier (frequency f0), the measurement target magnetic field MF1 (frequency f1), 1/f noise, and thermal noise. Among the output components of the magnetic sensor 14, the 1/f noise and the measurement target magnetic field MF1 are low-frequency, while the component of the frequency f0+f1, the component of the frequency f0−f1, the component of the additional magnetic field MF0, and the thermal noise are high-frequency. Note that the thermal noise is low enough to be ignored compared to the component of the frequency f0+f1, the component of the frequency f0−f1, and the component of the additional magnetic field MF0.

Figure 8A:
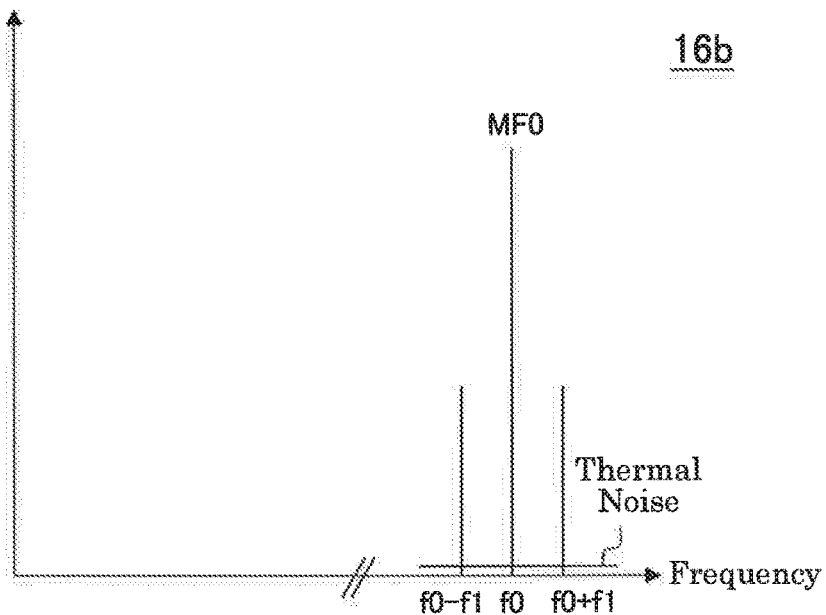
FIGS. 8A and 8B show the spectrum of the output of the high-pass filter 16b (FIG. 8A) and the output of the detecting section (deriving section) 16c (FIG. 8B)
Figure 8B:
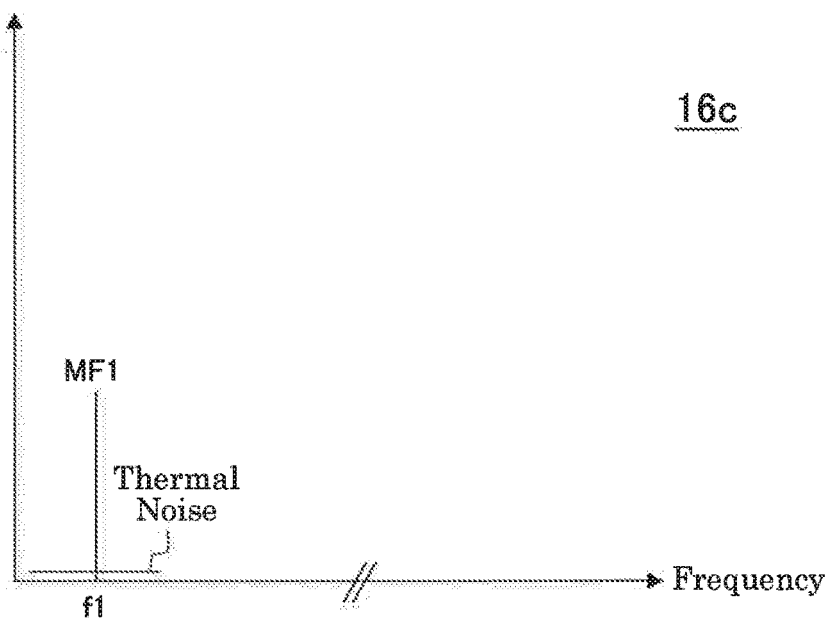

The output of the magnetic sensor 14 is amplified by the amplifier 16a and provided to the high-pass filter 16b. The output of the high-pass filter 16b is provided to the detecting section (deriving section) 16c, FIG. 8 shows the spectrum of the output of the high-pass filter 16b (FIG. 8A) and the output of the detecting section (deriving section) 16c (FIG. 8B). Note that in FIG. 8, the horizontal axis is partially skipped between the frequency f1 and the frequency f0.

With reference to FIG. 8A, when the output of the magnetic sensor 14 is provided to the high-pass filter 16b, the 1/f noise and the measurement target magnetic field MF1 are attenuated significantly to be a level enough to be ignored. The component of the frequency f0+f1, the component of the frequency f0−f1, and the component of the additional magnetic field MF0 are hardly attenuated.

With reference to FIG. 8B, when the output of the high-pass filter 16b is provided to the detecting section (deriving section) 16c, detection can be made to obtain the component of the measurement target magnetic field MF1 (frequency f1). Note that the output of the detecting section 16c also includes thermal noise, which is low enough to be ignored compared to the component of the measurement target magnetic field MF1.

In accordance with the first embodiment, errors in measurements of the measurement target magnetic field MF1 by the measuring apparatus 1 due to 1/f noise generated in the magnetic sensor 14 can be reduced.

That is, the output of the magnetic sensor 14 includes a result of a carrier, which is provided by the pulse of the same frequency f0 as that of the additional magnetic field MF0 (see FIG. 6C), modulated by the measurement target magnetic field MF1 (the component of the frequency f0+f1 and the component of the frequency f0−f1). Here, even if 1f noise may be generated in the magnetic sensor 14, the component of the frequency f0+f1 and the component of the frequency f0−f1 output from the magnetic sensor 14 include only a level of 1/f noise low enough to be ignored (see FIG. 7). Accordingly, when the component of the frequency f0+f1 and the component of the frequency f0−f1 are demodulated to obtain a component of the measurement target magnetic field MF1 (frequency f1), the component is to include only a level of 1/f noise low enough to be ignored.

Second Embodiment

A measuring apparatus 1 according to a second embodiment differs from the measuring apparatus 1 according to the first embodiment in that a summing section 15 is provided to sum outputs of multiple magnetic sensors 14 for provision to one deriving section 16c.

Figure 9:
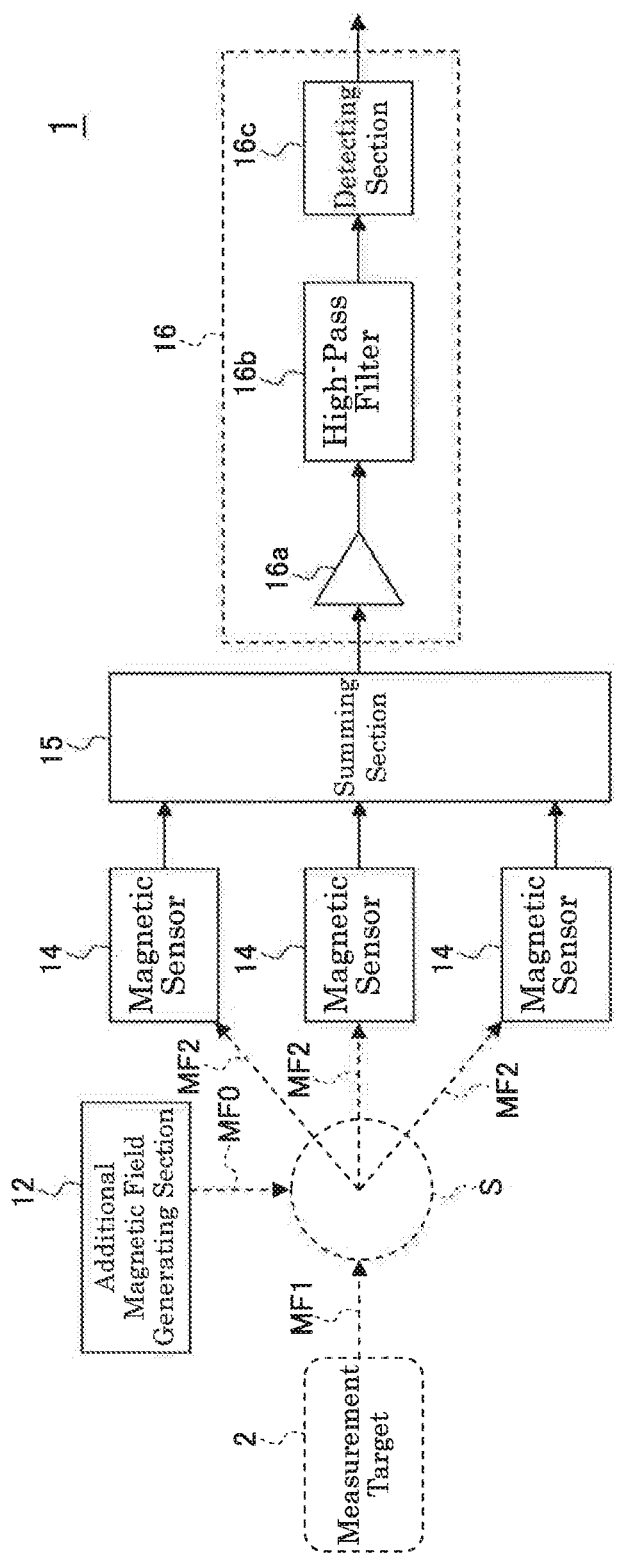
FIG. 9 is a functional block diagram showing the configuration of the measuring apparatus 1 according to the second embodiment of the present invention.

FIG. 9 is a functional block diagram showing the configuration of the measuring apparatus 1 according to the second embodiment of the present invention. The measuring apparatus 1 according to the second embodiment is arranged to measure a measurement target amount (e.g. measurement target magnetic field MF1) generated by a measurement target 2 (e.g. heart), including an additional magnetic field generating section (additional amount generating section) 12, a magnetic sensor 14, a summing section 15, and a sensor output processing section 16.

The additional magnetic field generating section 12 is the same as that in the first embodiment and will not be described.

Multiple (three in the example of FIG. 9) magnetic sensors 14 are provided, each arranged to measure a composite magnetic field MF2 at approximately the same site in the space S. The summing section 15 is arranged to sum the outputs of the multiple magnetic sensors 14 for provision to one detecting section (deriving section) 16c via the amplifier 16a and the high-pass filter 16b.

The amplifier 16a is arranged to amplify the output of the summing section 15 for provision to the high-pass filter 16b. The high-pass filter 16b and the detecting section 16c are the same as those in the first embodiment and will not be described.

Next will be described an operation according to the second embodiment.

A measurement target magnetic field MF1 generated by the measurement target 2 is added with an additional magnetic field MF0 generated by the additional magnetic field generating section 12 to be a composite magnetic field MF2 (=MF0+MF1) for provision to the multiple magnetic sensors 14.

The outputs of the multiple magnetic sensors 14 are summed by the summing section 15 for provision to the amplifier 16a. The subsequent operation is the same as that in the first embodiment and will not be described.

The second embodiment exhibits the same advantageous effects as the first embodiment.

In addition, the second embodiment exhibits the following advantageous effects. That is, the output of a magnetic sensor 14 is immixed with not only 1/f noise but also various types of noise and thereby has a reduced S/N ratio. Here, if the outputs of multiple (e.g. three) magnetic sensors 14 are summed, the signal (inherent output) from the magnetic sensors 14 is tripled simply, but the noise, which is random for each of the magnetic sensors 14, is not tripled simply. Even if the outputs of multiple (e.g. three) magnetic sensors 14 may be summed, the noise is roughly only the square root of the sum of the squares of noises of the magnetic sensors 14, which is less than three times. Accordingly, the sensor output processing section 16 processing the sum of the outputs of multiple (e.g. three) magnetic sensors 14 can increase the S/N ratio.

Third Embodiment

A measuring apparatus 1 according to a third embodiment differs from the measuring apparatus 1 according to the first embodiment in that outputs of the multiple magnetic sensors 142, 144, 146 are provided, respectively, to different deriving sections 16c.

Figure 10:
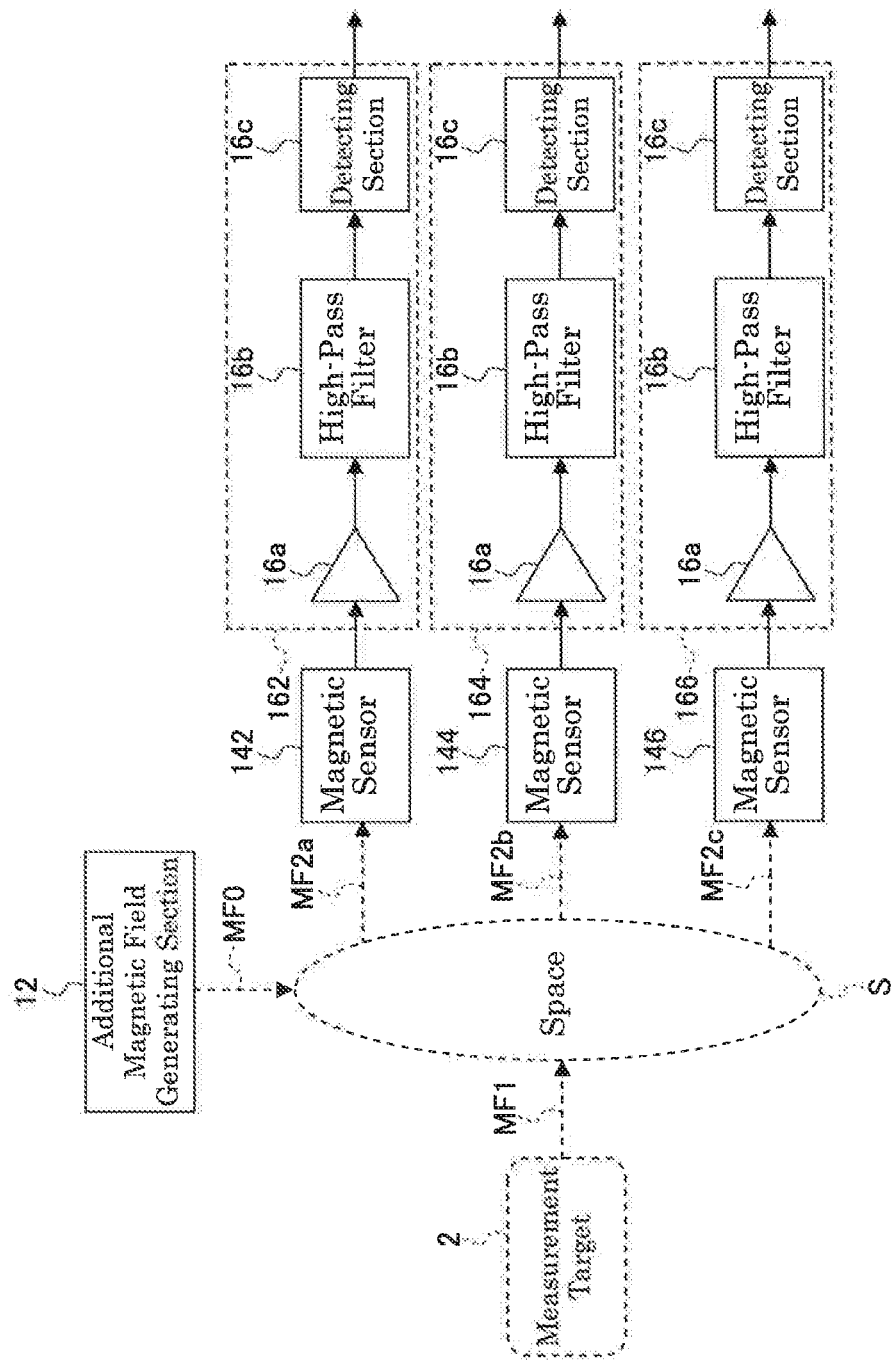
FIG. 10 is a functional block diagram showing the configuration of the measuring apparatus 1 according to the third embodiment of the present invention.

FIG. 10 is a functional block diagram showing the configuration of the measuring apparatus 1 according to the third embodiment of the present invention. The measuring apparatus 1 according to the third embodiment is arranged to measure a measurement target amount (e.g. measurement target magnetic field MF1) generated by a measurement target 2 (e.g. heart), including an additional magnetic field generating section (additional amount generating section) 12, magnetic sensors 142, 144, 146, and sensor output processing sections 162, 164, 166.

The additional magnetic field generating section 12 is the same as that in the first embodiment and will not be described.

Multiple (three in the example of FIG. 10) magnetic sensors 142, 144, 146 are provided. The multiple magnetic sensors 142, 144, 146 are arranged to measure composite magnetic fields MF2a, MF2b, MF2c, respectively, at different sites in the space S.

The outputs of the multiple magnetic sensors 142, 144, 146 are provided to different deriving sections 16c via amplifiers 16a and high-pass filters 16b within the respective different sensor output processing sections 162, 164, 166.

The amplifiers 16a within the sensor output processing sections 162, 164, 166 are arranged to amplify outputs of the respective multiple magnetic sensors 142, 144, 146. The high-pass filters 16b and the detecting sections 16c within the sensor output processing sections 162, 164, 166 are the same as those in the first embodiment and will not be described.

Next will be described an operation according to the third embodiment.

A measurement target magnetic field MF1 generated by the measurement target 2 is added with an additional magnetic field MF0 generated by the additional magnetic field generating section 12. The composite magnetic field MF2 includes different composite magnetic fields MF2a, MF2b, MF2c at different sites in the space S to be provided to the multiple magnetic sensors 142, 144, 146.

The outputs of the multiple magnetic sensors 142, 144, 146 are provided to the amplifiers 16a within the respective different sensor output processing sections 162, 164, 166. The subsequent operation is the same as that in the first embodiment and will not be described.

The third embodiment exhibits the same advantageous effects as the first embodiment.

Additionally, in accordance with the third embodiment, if there are different magnetic fields at different sites in the space S, it is possible to measure the distribution of magnetic fields in the space S. For example, if the measurement target 2 is a heart, it is possible to measure the distribution of magnetic fields of the heart over a wide range.

Fourth Embodiment

A measuring apparatus 1 according to a fourth embodiment differs from the measuring apparatus 1 according to the third embodiment in that canceling coils (prefix error compensating sections) 132, 134, 136 are provided to add different composite magnetic fields MF2a, MF2b, MF2c to be provided to the multiple magnetic sensors 142, 144, 146 with error compensation amounts for provision to the multiple magnetic sensors 142, 144, 146.

Figure 11:
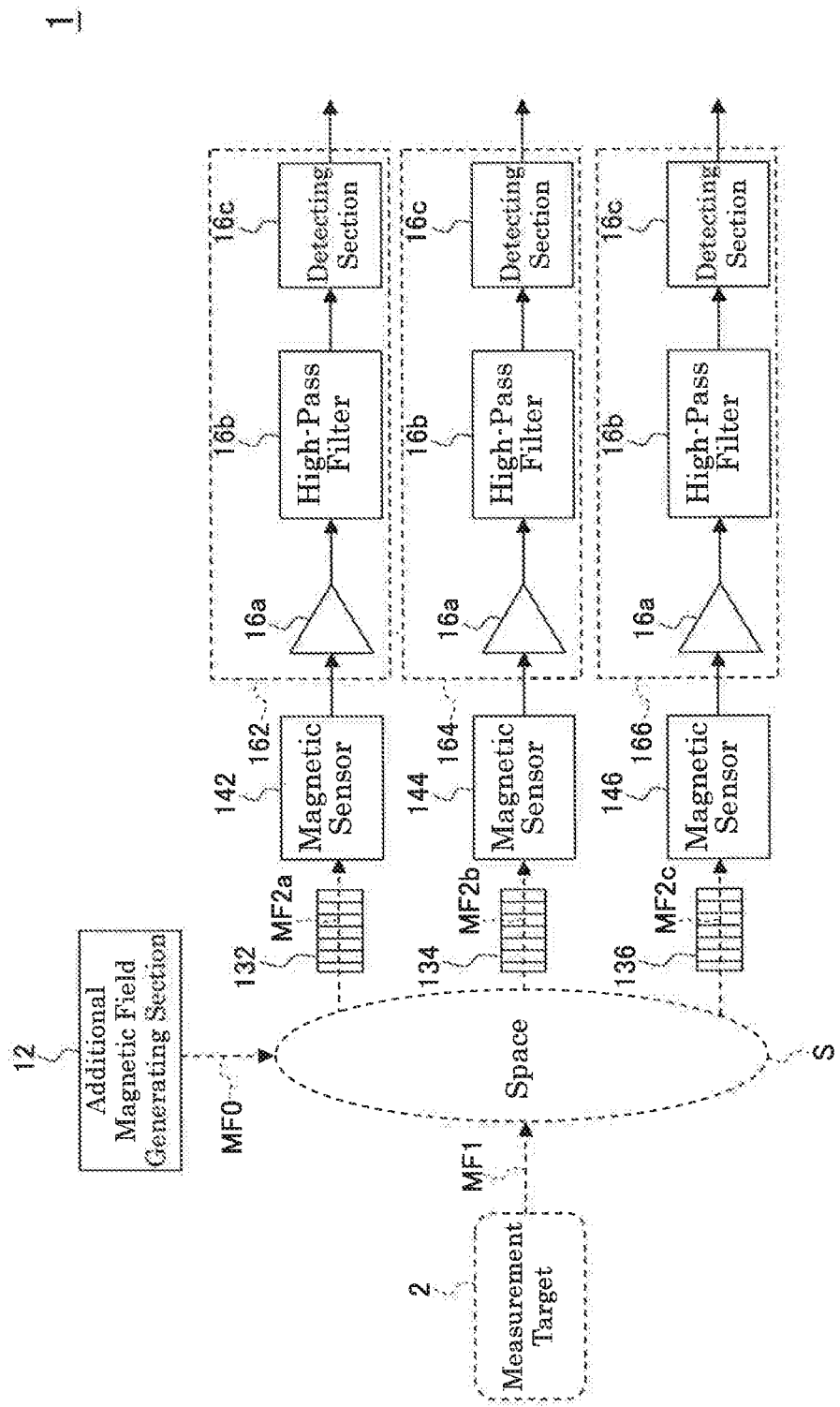
FIG. 11 is a functional block diagram showing the configuration of the measuring apparatus 1 according to the fourth embodiment of the present invention.

FIG. 11 is a functional block diagram showing the configuration of the measuring apparatus 1 according to the fourth embodiment of the present invention. The measuring apparatus 1 according to the fourth embodiment is arranged to measure a measurement target amount (e.g. measurement target magnetic field MF1) generated by a measurement target 2 (e.g. heart), including an additional magnetic field generating section (additional amount generating section) 12, canceling coils (prefix error compensating sections) 132, 134, 136, magnetic sensors 142, 144, 146, and sensor output processing sections 162, 164, 166.

The additional magnetic field generating section 12, the magnetic sensors 142, 144, 146, and the sensor output processing sections 162, 164, 166 are the same as those in the third embodiment and will not be described.

The canceling coils (prefix error compensating sections) 132, 134, 136 are arranged prior to the magnetic sensors 142, 144, 146 (i.e. between the magnetic sensors 142, 144, 146 and the space S). The canceling coils (prefix error compensating sections) 132, 134, 136 are arranged to add the respective composite magnetic fields MF2a, MF2b, MF2c with error compensation amounts for provision to the respective multiple magnetic sensors 142, 144, 146. For example, applying a predetermined current to each of the canceling coils 132, 134, 136 allows to add the respective composite magnetic fields MF2a, MF2b, MF2c with magnetic fields for error compensation (error compensation amounts).

Here, the error compensation amounts are determined by, for example, the method described in paragraphs [0030] to [0033] of JP 2017-133993 A. That is, the sum of the outputs of the sensor output processing sections 162, 164, 166 is almost zero if there is no noise external to the measuring apparatus 1. Accordingly, the sum of the outputs of the sensor output processing sections 162, 164, 166 provides noise external to the measuring apparatus 1. Hence, the error compensation amounts are determined such that the sum of the outputs of the sensor output processing sections 162, 164, 166 becomes zero.

Next will be described an operation according to the fourth embodiment.

A measurement target magnetic field MF1 generated by the measurement target 2 is added with an additional magnetic field MF0 generated by the additional magnetic field generating section 12. The composite magnetic field MF2 includes different composite magnetic fields MF2a, MF2b, MF2c at different sites in the space S. A predetermined current is applied to each of the canceling coils 132, 134, 136 and the composite magnetic fields MF2a, MF2b, MF2c are added, respectively, with magnetic fields for error compensation (error compensation amounts). The composite magnetic fields MF2a, MF2b, MF2c thus added, respectively, with the magnetic fields for error compensation are provided to the respective multiple magnetic sensors 142, 144, 146.

The subsequent operation is the same as that in the third embodiment and will not be described.

The fourth embodiment exhibits the same advantageous effects as the first embodiment.

Additionally, in accordance with the fourth embodiment, it is possible to reduce errors in measurements due to noise external to the measuring apparatus 1.

For example, as the noise external to the measuring apparatus 1, there may be ambient noise of a level higher than 1/f noise (e.g. magnetic noise from a 50 Hz utility power source, an air conditioner, or the like). Leaving such ambient noise unattended would cause errors in measurements. Here, in accordance with the fourth embodiment, it is possible to reduce errors in measurements due to such ambient noise.

Fifth Embodiment

A measuring apparatus 1 according to a fifth embodiment differs from the measuring apparatus 1 according to the fourth embodiment in that outputs of the multiple magnetic sensors 142, 144, 146 are converted into digital and provided, respectively, to the detecting sections (deriving sections) 16c of the sensor output processing sections 162, 164, 166.

Figure 12:
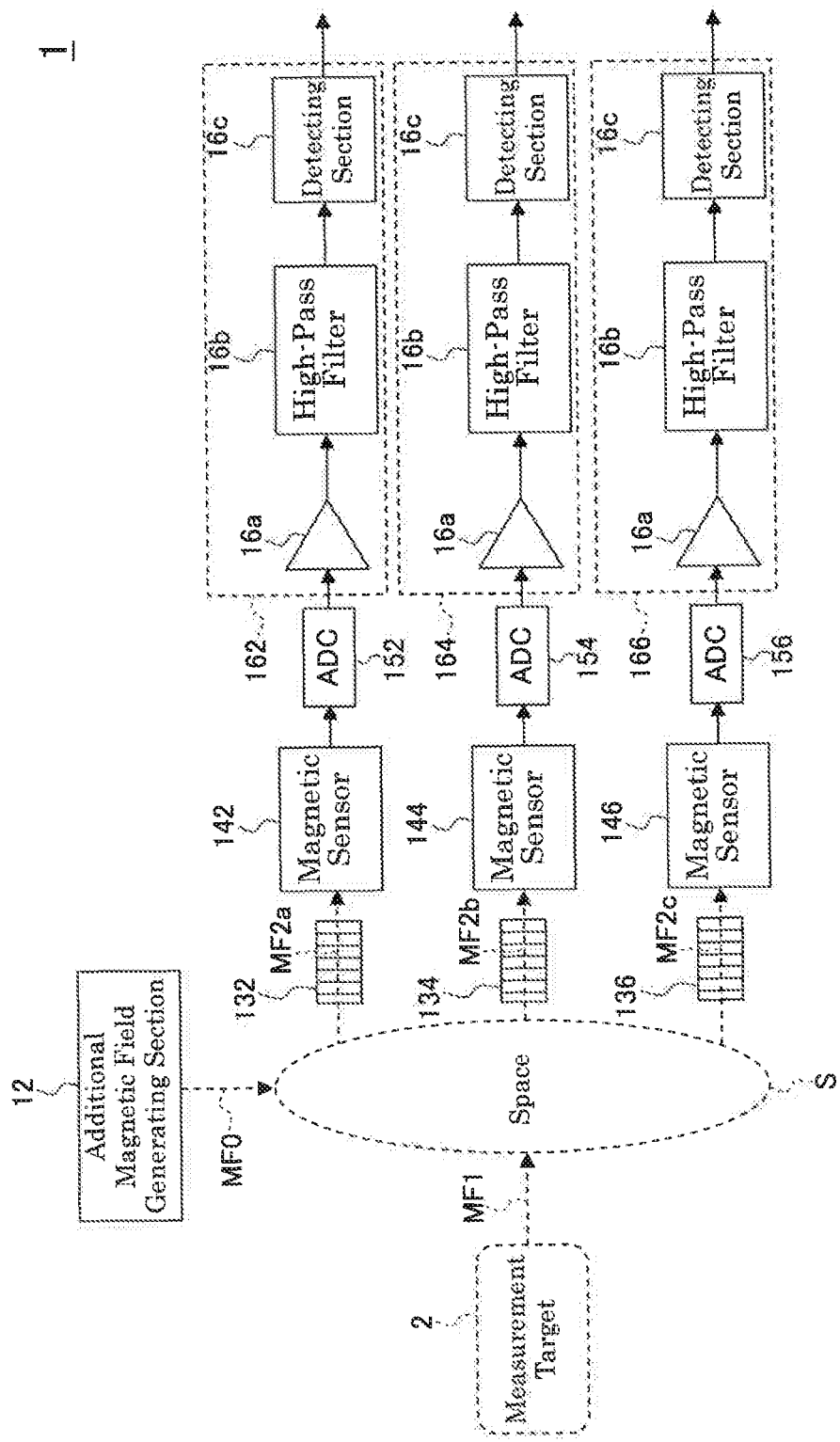
FIG. 12 is a functional block diagram showing the configuration of the measuring apparatus 1 according to the fifth embodiment of the present invention.

FIG. 12 is a functional block diagram showing the configuration of the measuring apparatus 1 according to the fifth embodiment of the present invention. The measuring apparatus 1 according to the fifth embodiment is arranged to measure a measurement target amount (e.g. measurement target magnetic field MF1) generated by a measurement target 2 (e.g. heart), including an additional magnetic field generating section (additional amount generating section) 12, canceling coils (prefix error compensating sections) 132, 134, 136, magnetic sensors 142, 144, 146, ADCs 152, 154, 156, and sensor output processing sections 162, 164, 166.

The additional magnetic field generating section 12, the canceling coils (prefix error compensating sections) 132, 134, 136, and the magnetic sensors 142, 144, 146 are the same as those in the fourth embodiment and will not be described. Note that a current may be supplied in a PWM manner to each of the canceling coils 132, 134, 136.

The ADCs 152, 154, 156 are arranged to convert outputs of the respective multiple magnetic sensors 142, 144, 146 into digital for provision to the detecting sections (deriving sections) 16c of the sensor output processing sections 162, 164, 166 via the amplifiers 16a and the high-pass filters 16b. The sensor output processing sections 162, 164, 166 are the same as those in the fourth embodiment except that they are each implemented by components that can process digital signals (e.g. a waveform equalizer, an FIR, filter, an adaptive filter, and the like).

Next will be described an operation according to the fifth embodiment.

A measurement target magnetic field MF1 generated by the measurement target 2 is added with an additional magnetic field MF0 generated by the additional magnetic field generating section 12. The composite magnetic field MF2 includes different composite magnetic fields MF2a, MF2b, MF2c at different sites in the space S. A predetermined current is applied to each of the canceling coils 132, 134, 136 and the composite magnetic fields MF2a, MF2b, MF2c are added, respectively, with magnetic fields for error compensation (error compensation amounts). The composite magnetic fields MF2a, MF2b, MF2c thus added, respectively, with the magnetic fields for error compensation are provided to the respective multiple magnetic sensors 142, 144, 146.

The outputs of the magnetic sensors 142, 144, 146 are provided to the respective ADCs 152, 154, 156 and converted into digital for provision to the sensor output processing sections 162, 164, 166.

The subsequent operation is the same as that in the fourth embodiment and will not be described.

The fifth embodiment exhibits the same advantageous effects as the first embodiment.

Additionally, in accordance with the fifth embodiment, circuit size reduction, computerized control, and cable-less can be achieved in the measuring apparatus 1.

It is noted that as a variation for the firth embodiment, the canceling coils 132, 134, 136 may be substituted with an analog signal processing section or a digital signal processing section having the same functionality. Also, bus wiring may be used for connection between the components of the measuring apparatus 1, and the bus wiring may be substituted with fiber optics (allowing for high-speed serial communications) or wireless (Wi-Fi, Bluetooth (registered trademark), or the like).

Sixth Embodiment

A measuring apparatus 1 according to a sixth embodiment differs from the measuring apparatus 1 according to the fifth embodiment in that an external error compensating section 182 is provided to compensate for an error due to an external environment upon receiving outputs of the detecting sections (deriving sections) 16c.

Figure 13:
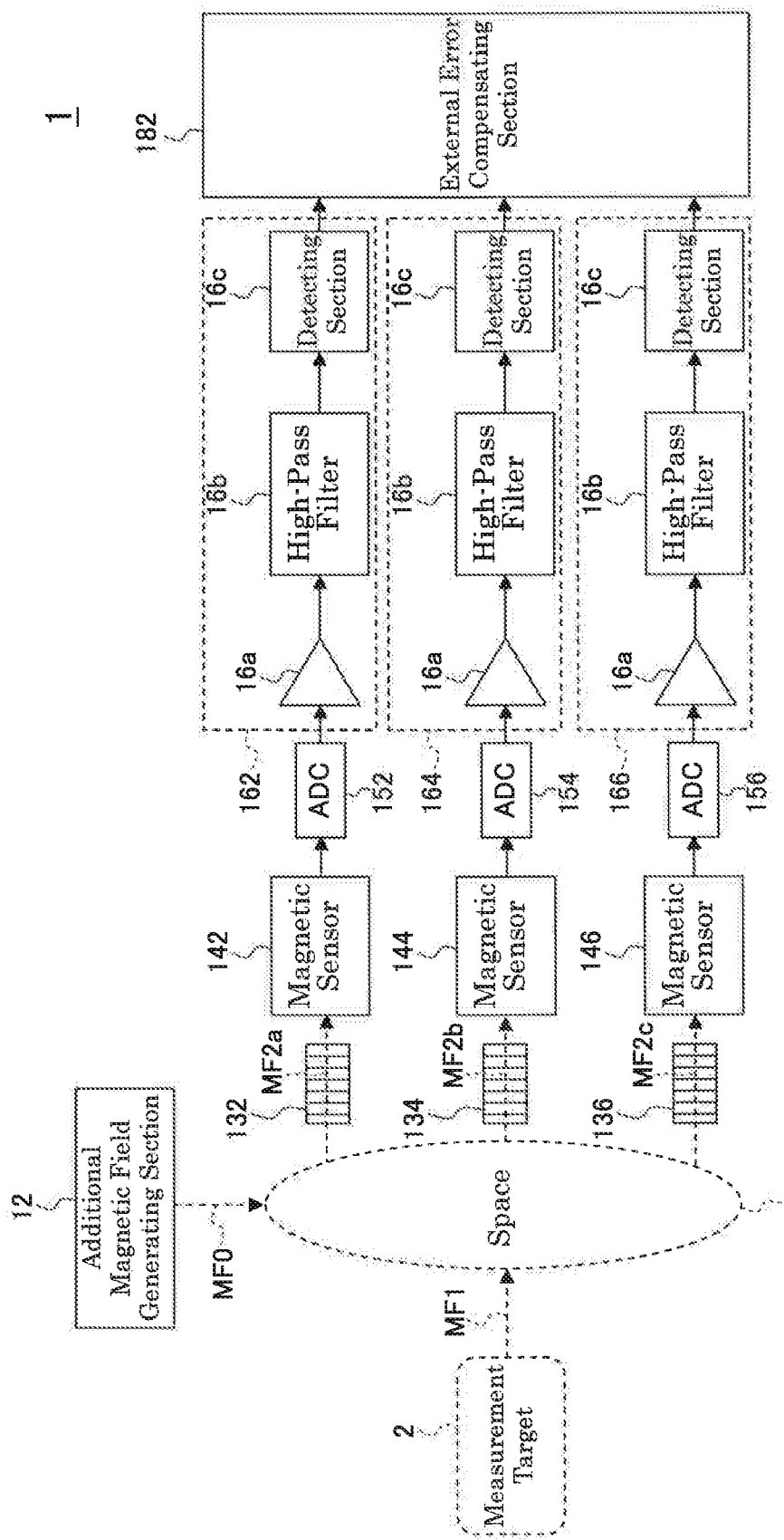
FIG. 13 is a functional block diagram showing the configuration of the measuring apparatus 1 according to the sixth embodiment of the present invention.

FIG. 13 is a functional block diagram showing the configuration of the measuring apparatus 1 according to the sixth embodiment of the present invention. The measuring apparatus 1 according to the sixth embodiment is arranged to measure a measurement target amount (e.g. measurement target magnetic field MF1) generated by a measurement target 2 (e.g. heart), including an additional magnetic field generating section (additional amount generating section) 12, canceling coils (prefix error compensating sections) 132, 134, 136, magnetic sensors 142, 144, 146, ADCs 152, 154, 156, sensor output processing sections 162, 164, 166, and an external error compensating section 182.

The additional magnetic field generating section (additional amount generating section) 12, the canceling coils (prefix error compensating sections) 132, 134, 136, the magnetic sensors 142, 144, 146, the ADCs 152, 154, 156, and the sensor output processing sections 162, 164, 166 are the same as those in the fifth embodiment and will not be described.

The external error compensating section 182 is arranged to receive the outputs of the detecting sections (deriving sections) 16c of the sensor output processing sections 162, 164, 166 to compensate for an error due to an external environment of the measuring apparatus 1. The error due to the external environment of the measuring apparatus 1 can be obtained as follows.

That is, the sum of the outputs of the sensor output processing sections 162, 164, 166 is almost zero if there is no noise external to the measuring apparatus 1. Accordingly, the arithmetic mean of the sum of the outputs of the sensor output processing sections 162, 164, 166 provides an error due to the external environment of the measuring apparatus 1.

Also, if the region in which the magnetic sensors 142, 144, 146 are arranged is significantly wider than the measurement target 2, the output of one of the magnetic sensors arranged away from the measurement target 2 do not include the measurement target magnetic field MF1 to provide an error due to the external environment of the measuring apparatus 1.

Upon thus obtaining an error due to the external environment, the external error compensating section 182 compensates for the error due to the external environment.

Next will be described an operation according to the sixth embodiment.

The operation to the outputs of the sensor output processing sections 162, 164, 166 is the same as that in the fifth embodiment and will not be described.

Based on the obtained error due to the external environment, the external error compensating section 182 compensates for the error due to the external environment of the measuring apparatus 1 in the outputs of the sensor output processing sections 162, 164, 166.

The sixth embodiment exhibits the same advantageous effects as the first embodiment.

Additionally, in accordance with the sixth embodiment, it is possible to compensate for the error due to the external environment of the measuring apparatus 1.

Seventh Embodiment

A measuring apparatus 1 according to a seventh embodiment differs from the measuring apparatus 1 according to the fifth embodiment in that an inter-channel error compensating section 184 is provided to compensate for an error between channels. Note that each channel has a certain one of the magnetic sensors and a certain one of the detecting sections (deriving sections) 16c that receives the output of the magnetic sensor.

Figure 14:
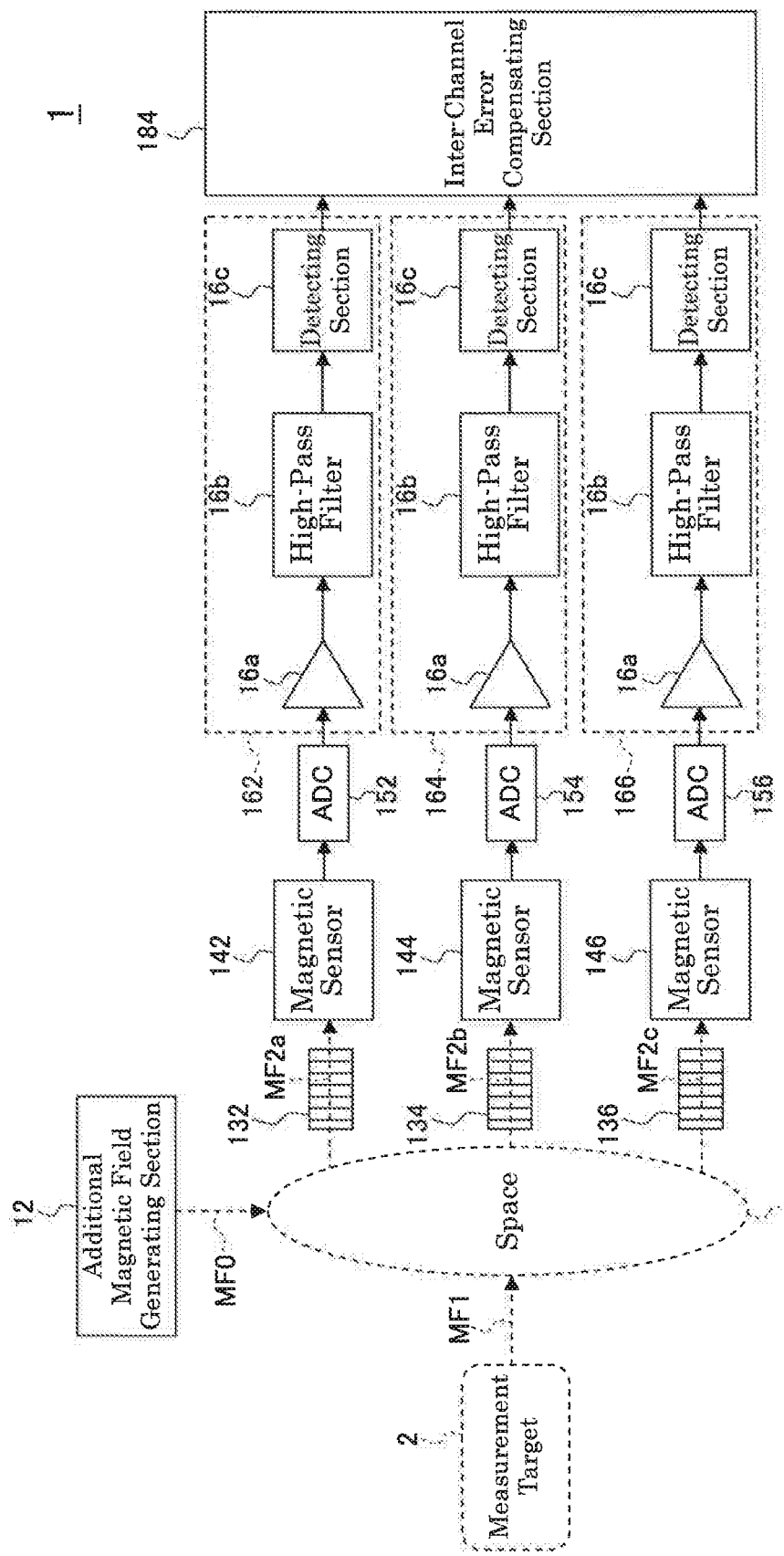
FIG. 14 is a functional block diagram showing the configuration of the measuring apparatus 1 according to the seventh embodiment of the present invention.

FIG. 14 is a functional block diagram showing the configuration of the measuring apparatus 1 according to the seventh embodiment of the present invention. The measuring apparatus 1 according to the seventh embodiment is arranged to measure a measurement target amount (e.g. measurement target magnetic field MF1) generated by a measurement target 2 (e.g. heart), including an additional magnetic field generating section (additional amount generating section) 12, canceling coils (prefix error compensating sections) 132, 134, 136, magnetic sensors 142, 144, 146, ADCs 152, 154, 156, sensor output processing sections 162, 164, 166, and an inter-channel error compensating section 184.

The additional magnetic field generating section (additional amount generating section) 12, the canceling coils (prefix error compensating sections) 132, 134, 136, the magnetic sensors 142, 144, 146, the ADCs 152, 154, 156, and the sensor output processing sections 162, 164, 166 are the same as those in the fifth embodiment and will not be described.

Here, the canceling coil 132, the magnetic sensor 142, the ADC 152, and the sensor output processing section 162 is defined as Channel 1. The output of the magnetic sensor 142 is received by the deriving section 16c of the sensor output processing section 162 via the ADC 152 and the amplifier 16a and the high-pass filter 16b of the sensor output processing section 162.

Also, the canceling coil 134, the magnetic sensor 144, the ADC 154, and the sensor output processing section 164 is defined as Channel 2. The output of the magnetic sensor 144 is received by the deriving section 16c of the sensor output processing section 164 via the ADC 154 and the amplifier 16a and the high-pass filter 16b of the sensor output processing section 164.

Further, the canceling coil 136, the magnetic sensor 146, the ADC 156, and the sensor output processing section 166 is defined as Channel 3. The output of the magnetic sensor 146 is received by the deriving section 16c of the sensor output processing, section 166 via the ADC 156 and the amplifier 16a and the high-pass filter 16b of the sensor output processing section 166.

The inter-channel error compensating section 184 is arranged to compensate for an error between Channels 1, 2, and 3.

The error between Channels 1, 2, and 3 will be described. When a magnetic field of the same strength is applied to each of the canceling coils 132, 134, 136 of Channels 1, 2, and 3, the detecting sections (deriving sections) 16c of Channels 1, 2, and 3 are supposed to have the same output value. However, due to the difference in the characteristics (e.g. modulation and demodulation property) of Channels 1, 2, and 3, even the same input to Channels 1, 2, and 3 can result in different output values of Channels 1, 2, and 3. This is the error between Channels 1, 2, and 3.

Before measuring the measurement target 2 using the measuring apparatus 1, the additional magnetic field MF0 can be applied to the space (the measurement target magnetic field MF1 is not applied to the space S) and measured through Channels 1, 2, and 3 to obtain an error between Channels 1, 2, and 3. Channels 1, 2, and 3, which measure the same additional magnetic field MF0, are supposed to provide the same measurement. Hence, if Channels 1, 2, and 3 provide their respective different measurements, the difference in the measurements of Channels 1, 2, and 3 is the error between Channels 1, 2, and 3.

Next will be described an operation according to the seventh embodiment.

The operation to the outputs of the sensor output processing sections 162, 164, 166 is the same as that in the fifth embodiment and will not be described.

Based on the obtained error between Channels 1, 2, and 3, the inter-channel error compensating section 184 compensates for the error between Channels 1, 2, and 3 in the outputs of the sensor output processing sections 162, 164, 166.

The seventh embodiment exhibits the same advantageous effects as the first embodiment.

Additionally, in accordance with the seventh embodiment, it is possible to compensate for the error between Channels 1, 2, and 3.

Eighth Embodiment

A measuring apparatus 1 according to an eighth embodiment differs from the measuring apparatus 1 according to the fifth embodiment in that an error in the outputs of the deriving sections 16c in a frequency band high enough to ignore 1/f noise is measured and, based on the measurement, the frequency f0 of the pulse is determined.

Figure 15:
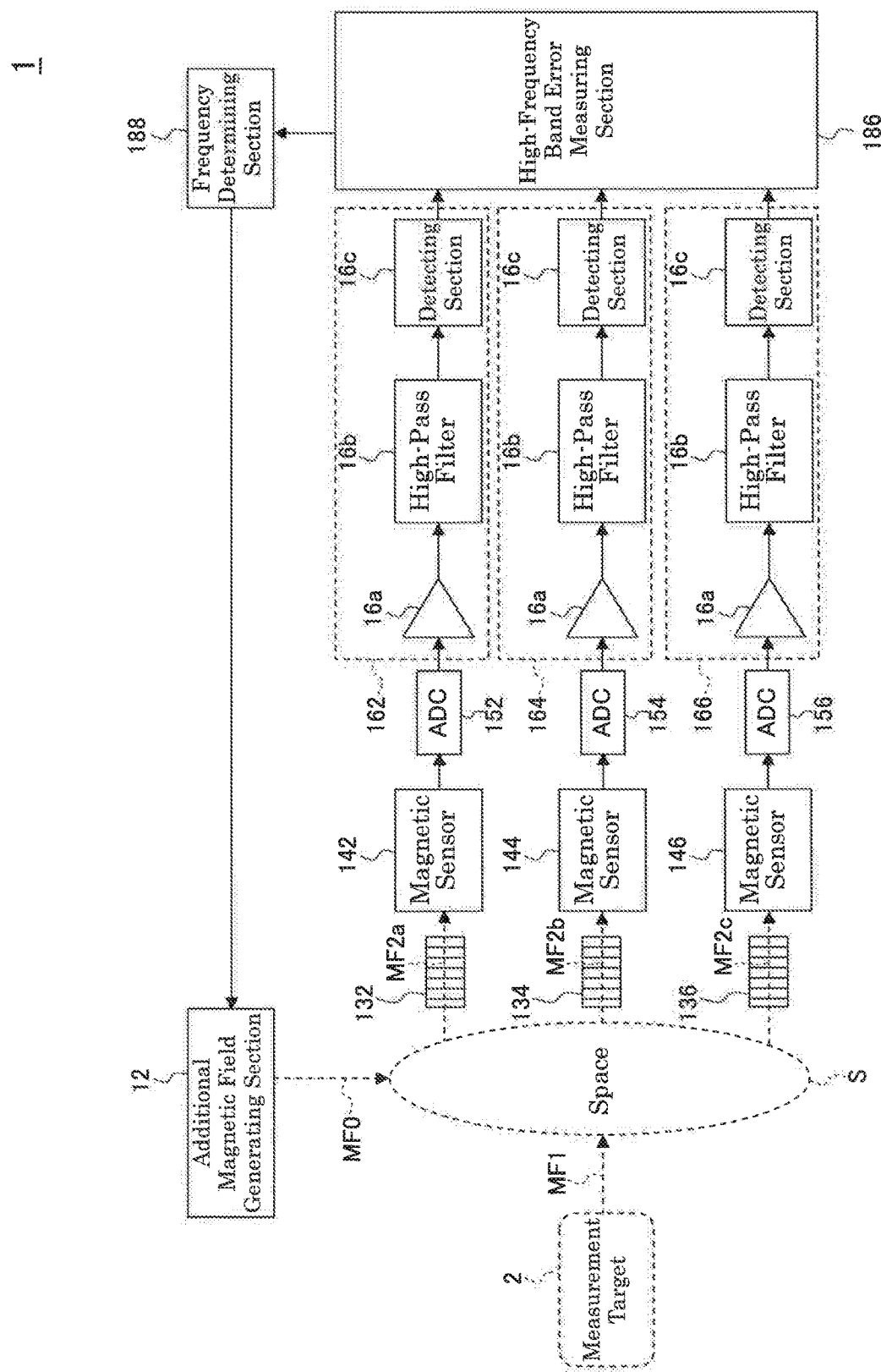
FIG. 15 is a functional block diagram showing the configuration of the measuring apparatus 1 according to the eighth embodiment of the present invention.

FIG. 15 is a functional block diagram showing the configuration of the measuring apparatus 1 according to the eighth embodiment of the present invention. The measuring apparatus 1 according to the eighth embodiment is arranged to measure a measurement target amount (e.g. measurement target magnetic field MF1) generated by a measurement target 2 (e.g. heart), including an additional magnetic field generating section (additional amount generating section) 12, canceling coils (prefix error compensating sections) 132, 134, 136, magnetic sensors 142, 144, 146, ADCs 152, 154, 156, sensor output processing sections 162, 164, 166, a high-frequency band error measuring section 186, and a frequency determining section 188.

The additional magnetic field generating section (additional amount generating section) 12, the canceling coils (prefix error compensating sections) 132, 134, 136, the magnetic sensors 142, 144, 146, the ADCs 152, 154, 156, and the sensor output processing sections 162, 164, 166 are the same as those in the fifth embodiment and will not be described.

The high-frequency band error measuring section 186 is arranged to measure an error in the outputs of the detecting sections (deriving sections) 16c in a frequency band high enough to ignore 1/f noise (e.g. frequency band higher than the 1/f corner frequency of 1/f noise). With reference to FIG. 7, the frequency band high enough to ignore 1/f noise only includes thermal noise, which is low enough to be ignored compared to the component of the frequency f0+f1 and the component of the frequency f0−f1. It is, however, conceivable that the frequency band high enough to ignore 1/f noise may include noise (e.g. ambient noise) that cannot be ignored compared to the component of the frequency f0+f1 and the component of the frequency f0−f1.

The frequency determining section 188 is arranged to determine the frequency f0 of the pulse based on a measurement of the high-frequency band error measuring section 186. The determination is arranged to be provided to the additional magnetic field generating section 12 such that the frequency of the (pulsed) additional magnetic field MF0 has the determined value f0.

For example, based on a measurement of the high-frequency band error measuring section 186, the frequency determining section 188 is arranged to determine a frequency band that only includes noise low enough to be ignored compared to the component of the frequency f0+f1 and the component of the frequency f0−f1 and determine that any frequency in the frequency band is set as the frequency f0 of the (pulsed) additional magnetic field MF0.

Next will be described an operation according to the eighth embodiment.

The operation to the outputs of the sensor output processing sections 162, 164, 166 is the same as that in the fifth embodiment and will not be described.

Before measuring the measurement target 2 using the measuring apparatus 1, the high-frequency band error measuring section 186 measures an error in the outputs of the detecting sections (deriving sections) 16c in a frequency band high enough to ignore 1/f noise. The frequency determining section 188 determines the frequency f0 of the (pulsed) additional magnetic field MF0 based on the error measured by the high-frequency band error measuring section 186 for provision to the additional magnetic field generating section 12. Thereafter, the measuring apparatus 1 measures the measurement target 2.

The eighth embodiment exhibits the same advantageous effects as the first embodiment.

Additionally, in accordance with the eighth embodiment, the frequency f0 can be determined to only include noise low enough to be ignored compared to the component of the frequency f0+f1 and the component of the frequency f0−f1.

The above-described embodiments can also be implemented as follows. A medium (floppy (registered trademark) disk, CD-ROM, or the like) with a program recorded thereon for achieving the above-described sections (e.g. sensor output processing sections 16, 162, 164, 166) may be read by a computer including a CPU, a hard disk, and a medium reader and installed in the hard disk. Such an approach can also perform the above-described functions.

What is claimed is:

1. A measuring apparatus that measures a measurement target amount generated from a measurement target, the apparatus comprising:
    an additional amount generating section that generates an additional amount to be added to the measurement target amount;
    a sensor that measures a composite amount of the measurement target amount added with the additional amount; and
    a deriving section that derives the measurement target amount from an output of the sensor, wherein
    1/f noise is generated during measurement by the sensor,
    the output value of the sensor when the composite amount is less than zero is equal to the output value of the sensor when the composite amount is zero,
    the additional amount is a pulse, wherein
        the pulse has an amplitude higher than the absolute value of the maximum of the measurement target amount,
        the maximum of the pulse is zero, and
        the pulse has a frequency high enough to ignore the 1/f noise, and
    the deriving section detects the output value of the sensor to derive the measurement target amount.

2. The measuring apparatus according to claim 1, wherein the measurement target amount is a magnetic field.

3. The measuring apparatus according to claim 1, further comprising a high-pass filter that receives an output of the sensor and attenuates the 1/f noise to be lower than a component of the same frequency as that of the pulse for provision to the deriving section.

4. The measuring apparatus according to claim 1, further comprising a summing section that sums outputs of a plurality of the sensors for provision to one of a plurality of the deriving sections.

5. The measuring apparatus according to claim 1, wherein outputs of a plurality of the sensors are provided, respectively, to a plurality of the deriving sections.

6. The measuring apparatus according to claim 1, further comprising a prefix error compensating section that adds an error compensation amount to the composite amount for provision to the sensor.

7. The measuring apparatus according to claim 1, wherein an analog output of the sensor is converted into digital for provision to the deriving section.

8. The measuring apparatus according to claim 7, further comprising an external error compensating section that receives an output of the deriving section to compensate for an error due to the external environment.

9. The measuring apparatus according to claim 7, further comprising:
    a plurality of channels having a certain one of a plurality of the sensors and a certain one of a plurality of the deriving sections that receives an output of the sensor; and
    an inter-channel error compensating section that compensates for an error between the channels.

10. The measuring apparatus according to claim 7, further comprising:
    a high-frequency band error measuring section that measures an error in the output of the deriving section in a frequency band high enough to ignore the 1/f noise; and
    a frequency determining section that determines the frequency of the pulse based on a measurement of the high-frequency band error measuring section.

11. A measuring method for measuring a measurement target amount generated from a measurement target, the method comprising:
    generating an additional amount to be added to the measurement target amount;
    measuring a composite amount of the measurement target amount added with the additional amount by using a sensor; and
    deriving the measurement target amount from an output of the sensor, wherein
    1/f noise is generated during measurement by the sensor,
    the output value of the sensor when the composite amount is less than zero is equal to the output value of the sensor when the composite amount is zero,
    the additional amount is a pulse, wherein
        the pulse has an amplitude higher than the absolute value of the maximum of the measurement target amount,
        the maximum of the pulse is zero, and
        the pulse has a frequency high enough to ignore the 1/f noise, and
    the deriving detects the output value of the sensor to derive the measurement target amount.

12. A non-transitory computer-readable medium having a program of instructions for execution by a computer to perform a measuring process of a measuring apparatus that measures a measurement target amount generated from a measurement target, the apparatus including: an additional amount generating section that generates an additional amount to be added to the measurement target amount; and a sensor that measures a composite amount of the measurement target amount added with the additional amount, the measuring process comprising:
    deriving the measurement target amount from an output of the sensor, wherein
    1/f noise is generated during measurement by the sensor, the output value of the sensor when the composite amount is less than zero is equal to the output value of the sensor when the composite amount is zero, the additional amount is a pulse, wherein
the pulse has an amplitude higher than the absolute value of the maximum of the measurement target amount,
the maximum of the pulse is zero, and
the pulse has a frequency high enough to ignore the 1/f noise, and the deriving detects the output value of the sensor to derive the measurement target amount.

\* \* \* \* \*